(12) United States Patent
Liu et al.

(10) Patent No.: US 10,466,559 B2
(45) Date of Patent: Nov. 5, 2019

(54) PIXEL STRUCTURE

(71) Applicant: HANNSTAR DISPLAY CORPORATION, Taipei (TW)

(72) Inventors: Hsuan-Chen Liu, Kaohsiung (TW); Chung-Lin Chang, Kaohsiung (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 42 days.

(21) Appl. No.: 15/719,531

(22) Filed: Sep. 28, 2017

(65) Prior Publication Data

US 2018/0307073 A1     Oct. 25, 2018

(30) Foreign Application Priority Data

Apr. 24, 2017  (CN) .......................... 2017 1 0272129

(51) Int. Cl.
| | |
|---|---|
| *G02F 1/1368* | (2006.01) |
| *H01L 27/12* | (2006.01) |
| *H01L 29/786* | (2006.01) |
| *G02F 1/1333* | (2006.01) |
| *G02F 1/1343* | (2006.01) |
| *H01L 29/24* | (2006.01) |

(52) U.S. Cl.
CPC ........ *G02F 1/1368* (2013.01); *G02F 1/13439* (2013.01); *G02F 1/133345* (2013.01); *H01L 27/124* (2013.01); *H01L 27/1225* (2013.01); *H01L 27/1248* (2013.01); *H01L 29/24* (2013.01); *H01L 29/7869* (2013.01); *H01L 29/78609* (2013.01); *G02F 2201/121* (2013.01)

(58) Field of Classification Search
CPC ............. G02F 1/1368; G02F 1/133345; G02F 1/13439; G02F 2001/134372; G02F 2201/121; H01L 27/1225; H01L 27/124; H01L 27/1248; H01L 29/24; H01L 29/78609; H01L 29/7869

See application file for complete search history.

(56) References Cited

U.S. PATENT DOCUMENTS

| | | | |
|---|---|---|---|
| 2013/0187865 A1* | 7/2013 | Kuo .................... | G02F 1/13338 345/173 |
| 2014/0175467 A1* | 6/2014 | Choi ................. | G02F 1/134363 257/89 |
| 2015/0138481 A1* | 5/2015 | Yamayoshi ......... | H01L 27/1288 349/46 |

* cited by examiner

*Primary Examiner* — Nathanael R Briggs
(74) *Attorney, Agent, or Firm* — Winston Hsu

(57) ABSTRACT

A pixel structure includes a first substrate, a thin-film transistor, a second insulation layer, a first transparent conduction layer and a second substrate. The thin-film transistor includes a gate electrode formed on the first substrate, a semiconductor layer formed on the gate electrode, a first insulation layer located between the semiconductor layer and the gate electrode, and an electrode layer including a source electrode and a drain electrode. The source electrode covers a portion of the semiconductor layer. The drain electrode covers a portion of the semiconductor layer. The second insulation layer covers the thin-film transistor. The first transparent conduction layer is formed on the second insulation layer. An opening is formed in the first transparent conduction layer along a fringe of the semiconductor layer.

23 Claims, 12 Drawing Sheets

PIXEL STRUCTURE

BACKGROUND OF THE INVENTION

1. Field of the Invention

The present invention relates to a pixel structure, and more particularly, to a pixel structure capable of reducing induced current.

2. Description of the Prior Art

In general, a liquid crystal display panel in current industry is heading to high contrast ratio, high brightness, high color saturation, fast response and wide viewing angle. For maximizing the aperture ratio within limited space, ITO (Indium Tin Oxide) in a pixel structure usually covers with a whole piece as a common electrode. The induced current is generated between the TFT (Thin-film transistor) and the ITO above the TFT. The induced current is generated even if the TFT is off, such that the TFT has leakage current when the TFT is off. The leakage current of the TFT causes problems of uneven brightness of display panel and crosstalk.

SUMMARY OF THE INVENTION

The present invention provides a pixel structure capable of reducing induced current, in order to solve problems of the prior art.

According to an embodiment of the present invention, a pixel structure comprises a first substrate, a thin-film transistor, a second insulation layer, a first transparent conduction layer and a second substrate. The thin-film transistor comprises a gate electrode, a semiconductor layer, a first insulation layer and an electrode layer. The gate electrode is formed on the first substrate. The semiconductor layer is formed on the gate electrode. The first insulation layer is located between the semiconductor layer and the gate electrode. The electrode layer comprises a source electrode and a drain electrode. The source electrode covers a portion of the semiconductor layer. The drain electrode covers a portion of the semiconductor layer. The second insulation layer covers the thin-film transistor. The thickness of the second insulation layer is less than 11000 Å. The first transparent conduction layer is formed on the second insulation layer. The second substrate is arranged above the first substrate. An opening is formed in the first transparent conduction layer along a fringe of the semiconductor layer. A shape of the opening is corresponding to an outline of the fringe of the semiconductor layer.

According to another embodiment of the present invention, a pixel structure comprises a first substrate, a thin-film transistor, a second insulation layer, a first transparent conduction layer and a second substrate. The thin-film transistor comprises a gate electrode, a semiconductor layer, a first insulation layer and an electrode layer. The gate electrode is formed on the first substrate. The semiconductor layer is formed on the gate electrode. The first insulation layer is located between the semiconductor layer and the gate electrode. The electrode layer comprises a source electrode and a drain electrode. The source electrode covers a portion of the semiconductor layer. The drain electrode covers a portion of the semiconductor layer. The second insulation layer covers the thin-film transistor. The first transparent conduction layer is formed on the second insulation layer. The second substrate is arranged above the first substrate. An opening is formed in the first transparent conduction layer along a fringe of a region of the semiconductor layer not covered by the electrode layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
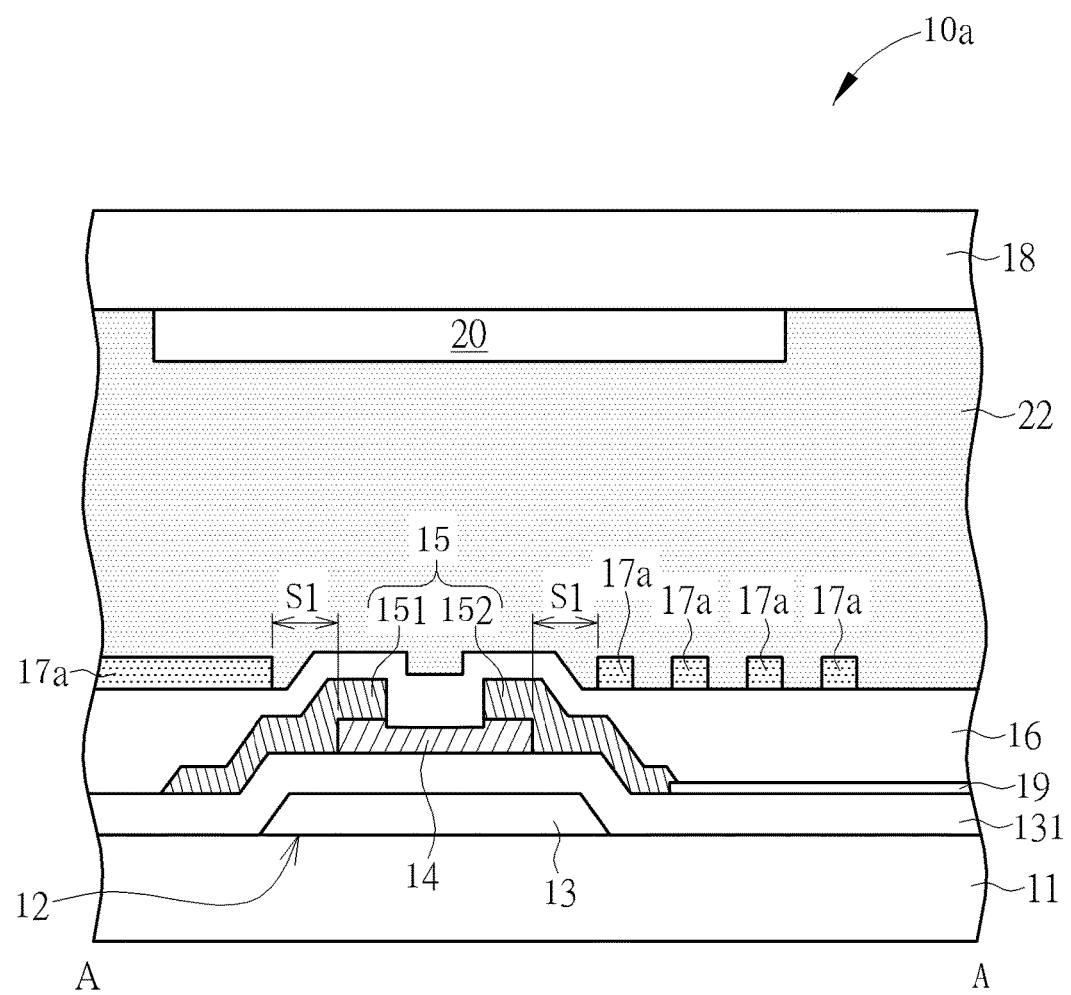
FIG. 1 is a cross-sectional view of a first pixel structure according to a first embodiment of the present invention.

Please refer to FIG. 1. FIG. 1 is a cross-sectional view of a first pixel structure according to a first embodiment of the present invention. As shown in FIG. 1, a first pixel structure 10a of a first embodiment of the present invention comprises a first substrate 11, a thin-film transistor 12, a transistor insulation layer 16, a transparent conduction layer 17a and a second substrate 18. The thin-film transistor 12 is formed on the first substrate 11. The thin-film transistor 12 comprises a gate electrode 13, a semiconductor layer 14 and an electrode layer 15. The gate electrode 13 is formed on the first substrate 11. The semiconductor layer 14 is formed on the gate electrode 13. A gate insulation layer 131 is formed between the semiconductor layer 14 and the gate electrode 13. The electrode layer 15 comprises a source electrode 151 and a drain electrode 152. The source electrode 151 and the drain electrode 152 respectively cover a portion of the semiconductor layer. The transistor insulation layer 16 covers the thin-film transistor 12. The transparent conduction layer 17a is formed on the transistor insulation layer 16. The second substrate 18 is arranged above the first substrate 11. In addition, a pixel electrode layer 19 is formed between the transistor insulation layer 16 and the gate insulation layer 131. In the present embodiment, the pixel electrode layer 19 is made of the same material as the transparent conduction layer 17a, but the present invention is not limited thereto.

Figure 2:
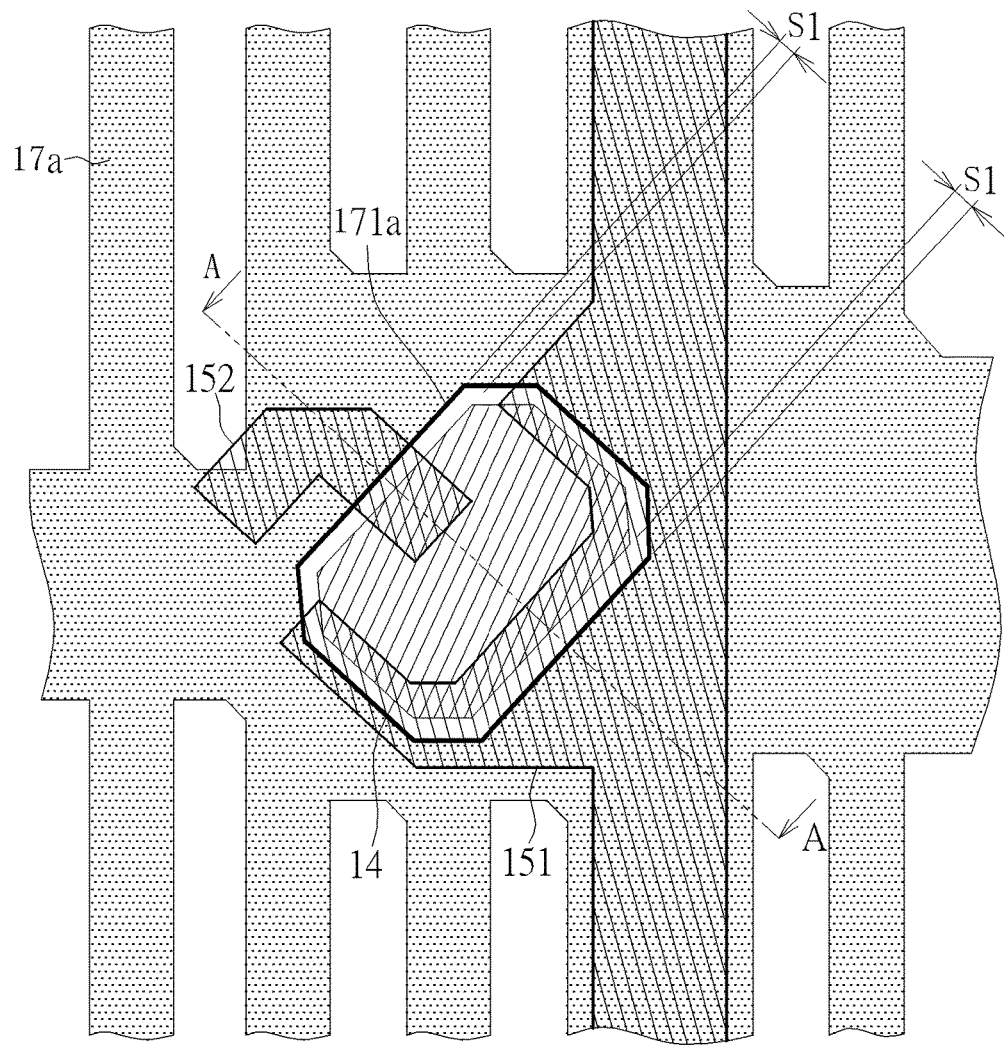
FIG. 2 is a top view of the first pixel structure of FIG. 1.

Please refer to FIG. 2, and also refer to FIG. 1. FIG. 2 is a top view of the first pixel structure of FIG. 1. For simplification, some elements of the pixel (such as the first substrate 11, the second substrate 18, the transistor insulation layer 16 and the gate electrode 13) structure is omitted in FIG. 2. FIG. 1 is the cross-sectional view in a direction A-A of FIG. 2 (points A in FIG. 2 are configured to show the direction, not to show the exact positions of the points). In the present embodiment, an opening 171a is formed in the transparent conduction layer 17a along a fringe of the semiconductor layer 14 (area of dotted line in FIG. 2), such that the transparent conduction layer 17a is not formed above the semiconductor layer 14. In other words, a shape of the opening 171a of the transparent conduction layer 17a is corresponding to an outline of the fringe of the semiconductor layer 14. In the present embodiment, the semiconductor layer 14 is a polygon which has more than four edges, but the present invention is not limited thereto. In another embodiment, the semiconductor layer 14 can be a triangle, quadrilateral, or rectangle. The shape of the opening 171a of the transparent conduction layer 17a is the same as the outline of the fringe of the semiconductor layer 14, but the present invention is not limited thereto. For example, the shape of the opening 171a of the transparent conduction layer 17a can be any other shape close to the outline of the fringe of the semiconductor layer 14. A portion of the opening 171a of the transparent conduction layer 17a can be aligned with or be overlapped or be away from the semiconductor layer 14. When the transparent conduction layer 17a is formed above the semiconductor layer 14, an induced current is generated between the transparent conduction layer 17a and the semiconductor layer 14 of the thin-film transistor 12. In general, the induced current can be reduced by thickening the transistor insulation layer 16. When a thickness of the transistor insulation layer 16 is above 30000 Å, the induced current between the transparent conduction layer 17a and the semiconductor layer 14 of the thin-film transistor 12 is too small to affect characteristic of the thin-film transistor 12. Such arrangement is able to prevent a display panel from uneven brightness and cross-talk. However, the thickness of the transistor insulation layer 16 is too thick, such that a distance between the transparent conduction layer 17a and the pixel electrode layer 19 is so far that the electric field between them is affected, so as to further affect the liquid crystal layer being driven. In the present embodiment, the thickness of the transistor insulation layer 16 is preferred less than 11000 Å. The induced current is reduced by forming the opening 171a in the transparent conduction layer 17a, not by thickening the transistor insulation layer 16. The transparent conduction layer 17a is not formed above the semiconductor layer 14 in order to prevent the induced current between the transparent conduction layer 17a and the semiconductor layer 14 of the thin-film transistor 12 from being generated.

Please refer to FIG. 1 again. A distance 51 is between a fringe of the orthographic projection of the transparent conduction layer 17a on the first substrate 11 and a fringe of the orthographic projection of the semiconductor layer 14 on the first substrate 11. In the present embodiment, the distance 51 is between 0 micrometers and 5 micrometers. In other words, the orthographic projection of the transparent conduction layer 17a on the first substrate 11 does not overlap the orthographic projection of the semiconductor layer 14 on the first substrate 11. In the present embodiment, the fringe of the orthographic projection of the transparent conduction layer 17a on the first substrate 11 is separated from the fringe of the orthographic projection of the semiconductor layer 14 on the first substrate 11 by a fixed distance, but the present invention is not limited thereto. In another embodiment of the present invention, the distance between the fringe of the orthographic projection of the transparent conduction layer 17a on the first substrate 11 and the fringe of the orthographic projection of the semiconductor layer 14 on the first substrate 11 can be changed and be arranged between 0 micrometers and 5 micrometers.

According to the above arrangement, the opening 171a is formed in the transparent conduction layer 17a of the first pixel structure 10a of the present invention, such that the transparent conduction layer 17a is not formed above the semiconductor layer 14, in order to reduce the induced current between the transparent conduction layer 17a and the semiconductor layer 14 of the thin-film transistor 12, so as to further reduce the leakage current of the thin-film transistor 12 when the thin-film transistor 12 is off. Therefore, the first pixel structure 10a of the present invention is able to solve problems of uneven brightness of display panel and cross-talk.

Figure 3:
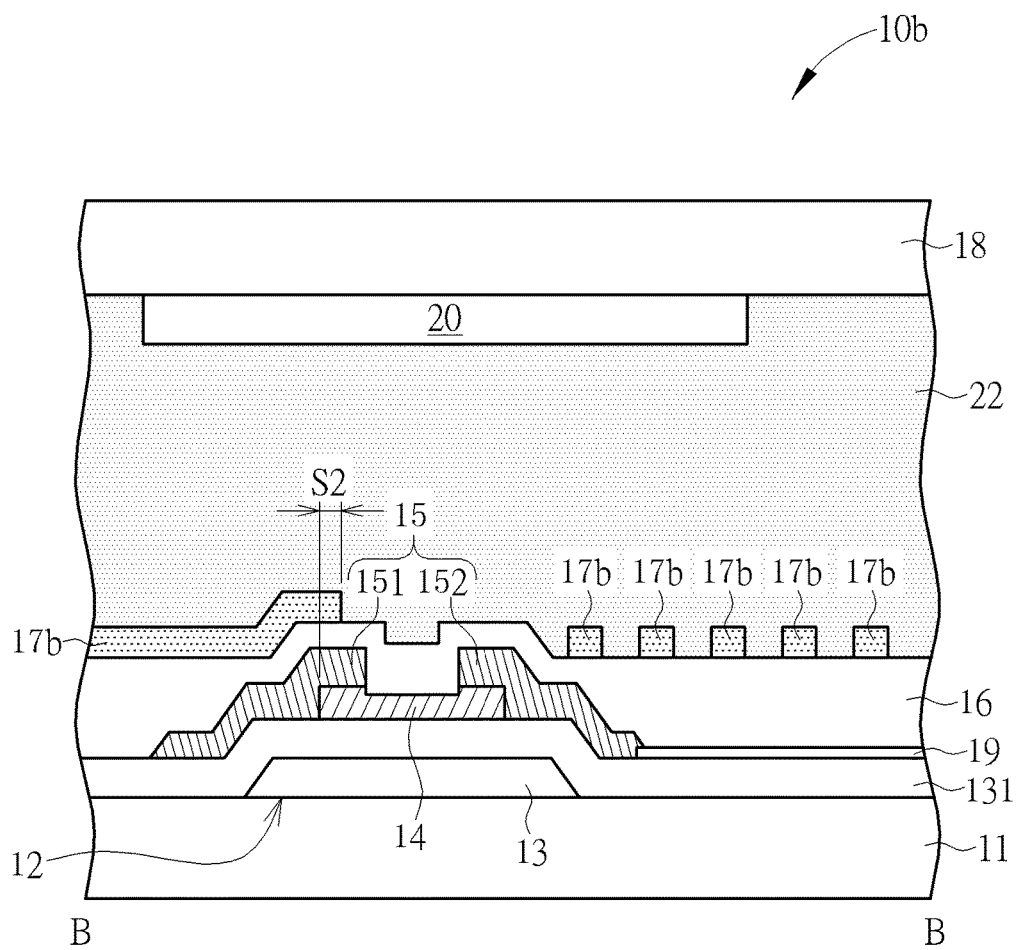
FIG. 3 is a cross-sectional view of a first pixel structure according to a second embodiment of the present invention.
Figure 4:
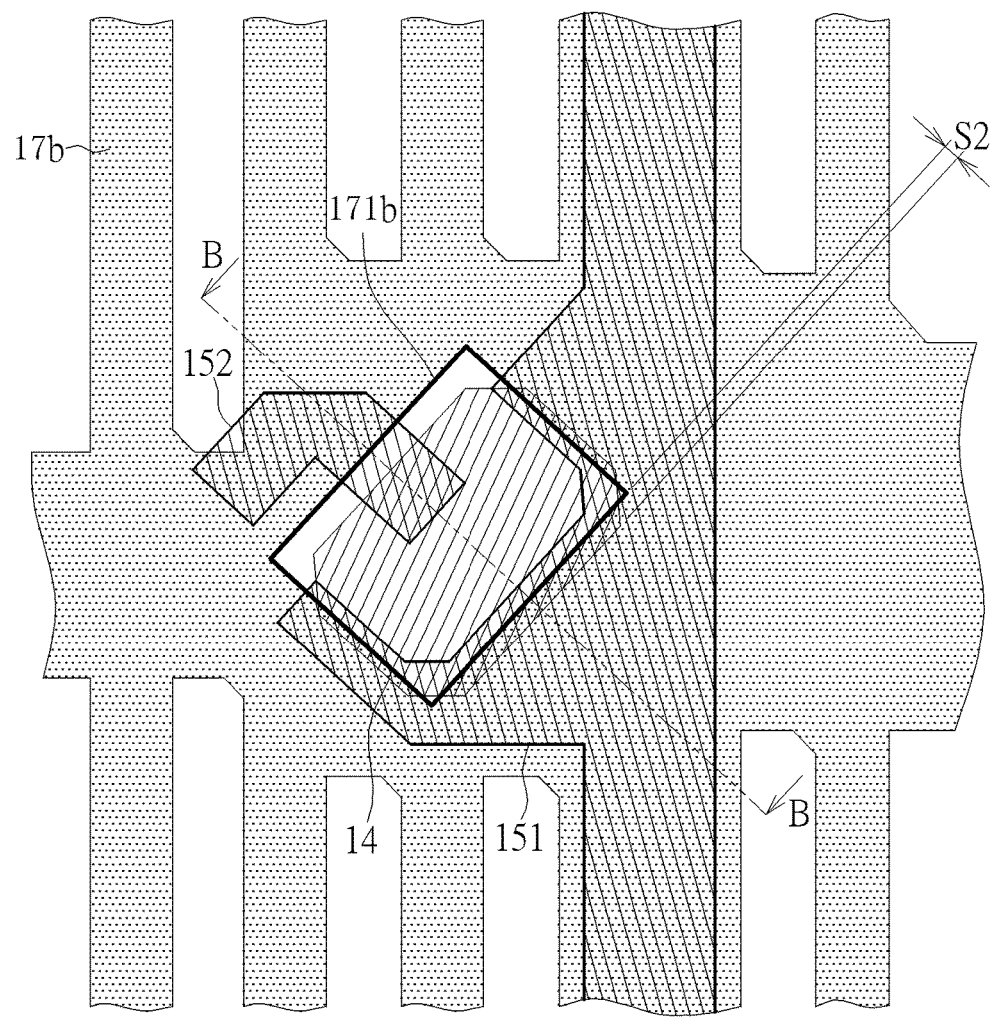
FIG. 4 is a top view of the first pixel structure of FIG. 3.

Please refer to FIG. 3 and also refer to FIG. 4. FIG. 3 is a cross-sectional view of a first pixel structure according to a second embodiment of the present invention. FIG. 4 is a top view of the first pixel structure of FIG. 3. FIG. 3 is the cross-sectional view along a direction B-B of FIG. 4 (points B in FIG. 4 are configured to show the direction, not to show the exact positions of the points). As shown in FIG. 3 and FIG. 4, a first pixel structure 10b of the second embodiment of the present invention is similar to the first pixel structure 10a of the first embodiment. The difference between them is a smaller opening 171b is formed in a transparent conduction layer 17b of the first pixel structure 10b of the second embodiment. The opening 171b is smaller than the opening 171a, such that a portion of the transparent conduction layer 17b is formed above the semiconductor layer 14. In other words, a portion of the orthographic projection of the transparent conduction layer 17b on the first substrate 11 overlaps the orthographic projection of the semiconductor layer 14 on the first substrate 11. An overlapping distance S2 is between two fringes of the two orthographic projections on the first substrate 11. The overlapping distance S2 can be less than 1.5 micrometers. In the overlapped region, even a portion of the transparent conduction layer 17b is formed above the semiconductor layer 14, since the source electrode 151 covers the semiconductor layer 14, the induced current between the transparent conduction layer 17b and the semiconductor layer 14 is small enough to ignore the leakage current of the thin-film transistor 12 when the thin-film transistor 12 is off. In the present embodiment, a dimension of the opening of the transparent conduction layer 17b is decreased. The induced current between transparent conduction layer 17b and the semiconductor layer 14 of the thin-film transistor 12 is controlled in an allowable range. It is worth noting that, the shape of the opening 171b of the transparent conduction layer 17b in FIG. 4 is a rectangle, but the present invention is not limited thereto. For example, the shape of the opening 171b of the transparent conduction layer 17b can be any other shape close to the outline of the fringe of the semiconductor layer 14.

Figure 5:
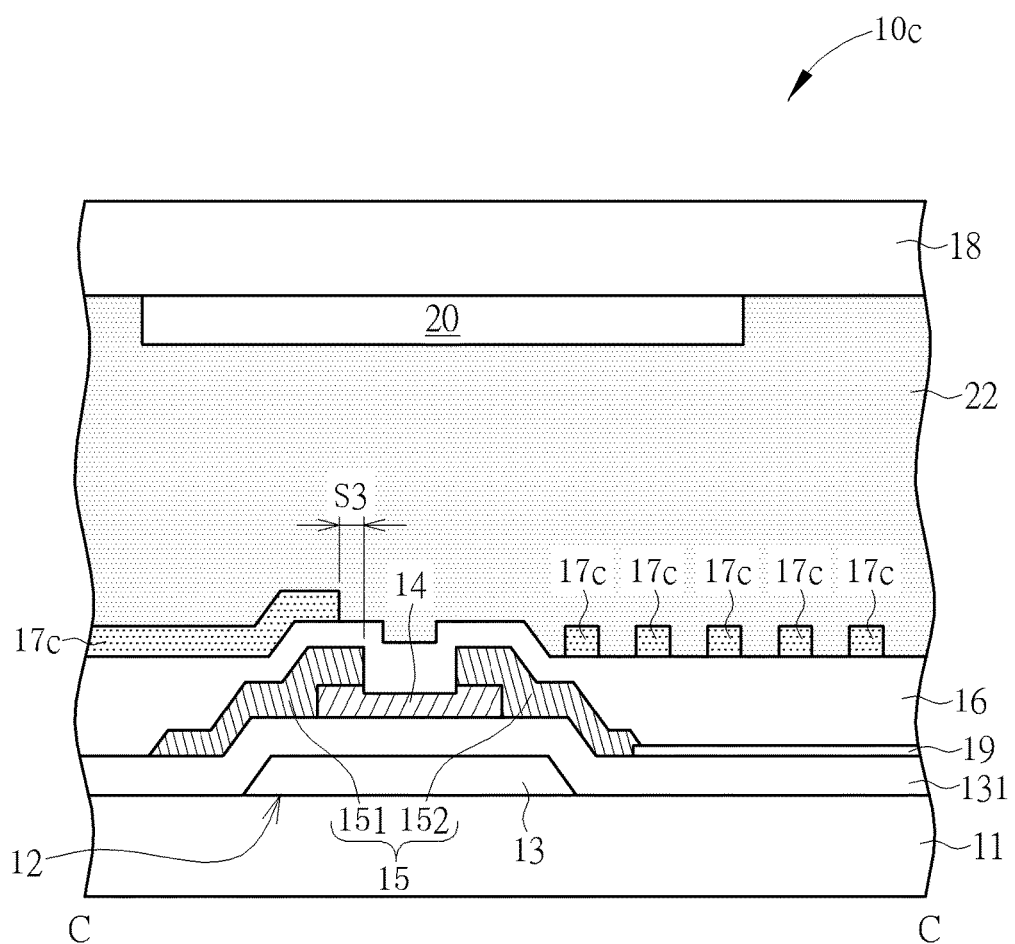
FIG. 5 is a cross-sectional view of a first pixel structure according to a third embodiment of the present invention.
Figure 6:
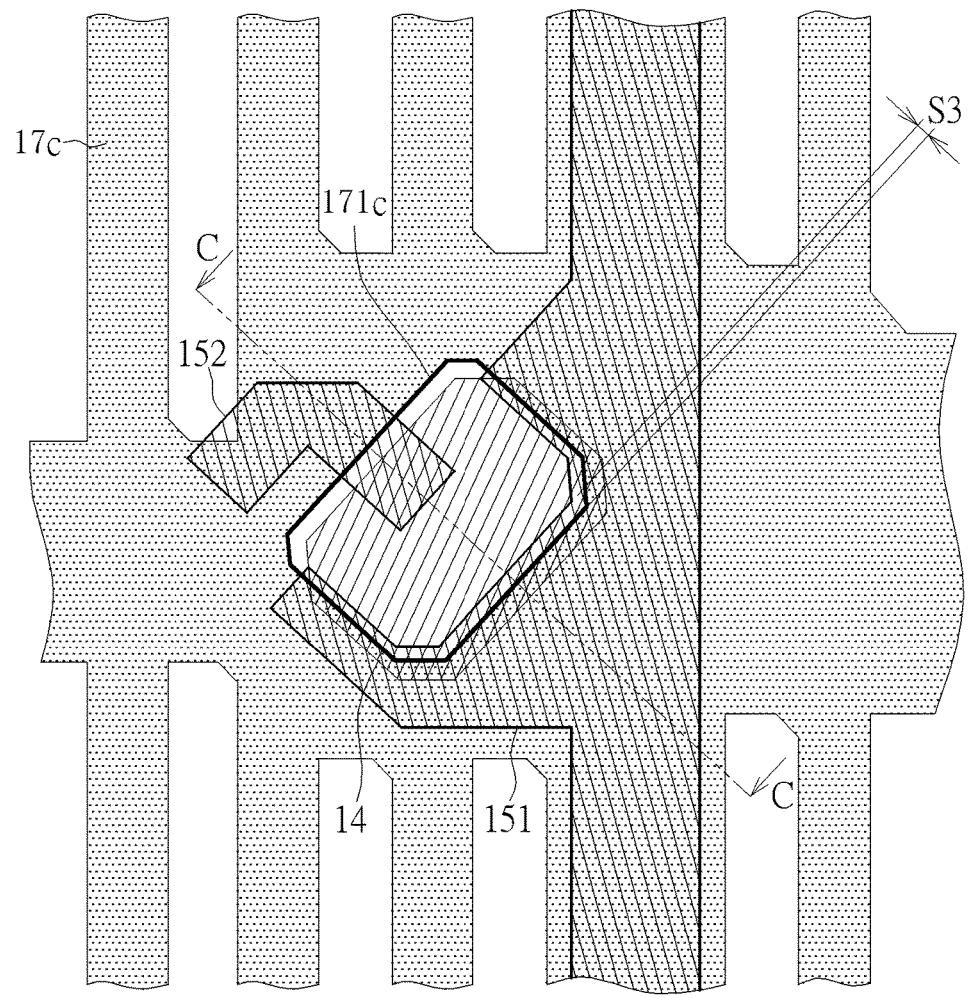
FIG. 6 is a top view of the first pixel structure of FIG. 5.

Please refer to FIG. 5 and also refer to FIG. 6. FIG. 5 is a cross-sectional view of a first pixel structure according to a third embodiment of the present invention. FIG. 6 is a top view of the first pixel structure of FIG. 5. FIG. 5 is the cross-sectional view along a direction C-C of FIG. 6 (points C in FIG. 6 are configured to show the direction, not to show the exact positions of the points). As shown in FIG. 5 and FIG. 6, a first pixel structure 10c of the third embodiment of the present invention is similar to the first pixel structure 10a of the first embodiment. The difference between them is an opening 171c is formed in the transparent conduction layer 17c of the first pixel structure 10c along a fringe of a region of the semiconductor layer 14 not covered by the electrode layer 15 (area of dotted line in FIG. 6). In other words, a shape of the opening 171c of the transparent conduction layer 17c is corresponding to an outline of the fringe of the region of the semiconductor layer 14 not covered by the electrode layer 15. In the present embodiment, the shape of the opening 171c of the transparent conduction layer 17c is the same as the outline of the fringe of the region of the semiconductor layer 14 not covered by the electrode layer 15, but the present invention is not limited thereto. For example, the shape of the opening 171c of the transparent conduction layer 17c can be any other shape close to the outline of the fringe of the region of the semiconductor layer 14 not covered by the electrode layer 15. A portion of the opening 171c of the transparent conduction layer 17c can be aligned with or be overlapped or be away from the semiconductor layer 14. Since the induced current of the transparent conduction layer 17c is mainly generated on the region of the semiconductor layer 14 not covered by the electrode layer 15. If the transparent conduction layer 17c is formed above the region of the semiconductor layer 14 not covered by the electrode layer 15, the induced current between the transparent conduction layer 17c and the semiconductor layer 14 of the thin-film transistor 12 is generated. In the present embodiment, the opening 171c of the transparent conduction layer 17c is formed along the fringe of the region of the semiconductor layer 14 not covered by the electrode layer 15, such that the transparent conduction layer 17c is not formed above the region of the semiconductor layer 14 not covered by the electrode layer 15. The arrangement of the opening 171c of the present embodiment is able to not only reduce the induced current between the transparent conduction layer 17c and the semiconductor layer 14 of the thin-film transistor 12, but also decrease the dimension of the opening.

Please refer to FIG. 5 again. A distance S3 is between a fringe of the orthographic projection of the transparent conduction layer 17c on the first substrate 11 and a fringe of the orthographic projection of the region of the semiconductor layer 14 not covered by the electrode layer 15 on the first substrate 11. In the present embodiment, the distance S3 is between 0 micrometers and 3.5 micrometers. In other words, the orthographic projection of the transparent conduction layer 17a on the first substrate 11 does not overlap the orthographic projection of the region of the semiconductor layer 14 not covered by the electrode layer 15 on the first substrate 11. In the present embodiment, the fringe of the orthographic projection of the transparent conduction layer 17a on the first substrate 11 is separated from the fringe of the orthographic projection of the region of the semiconductor layer 14 not covered by the electrode layer 15 on the first substrate 11 by a fixed distance, but the present invention is not limited thereto. In another embodiment of the present invention, a distance between the fringe of the orthographic projection of the transparent conduction layer 17a on the first substrate 11 and the fringe of the orthographic projection of the region of the semiconductor layer 14 not covered by the electrode layer 15 on the first substrate 11 can be changed and be arranged between 0 micrometers and 3.5 micrometers.

Figure 7:
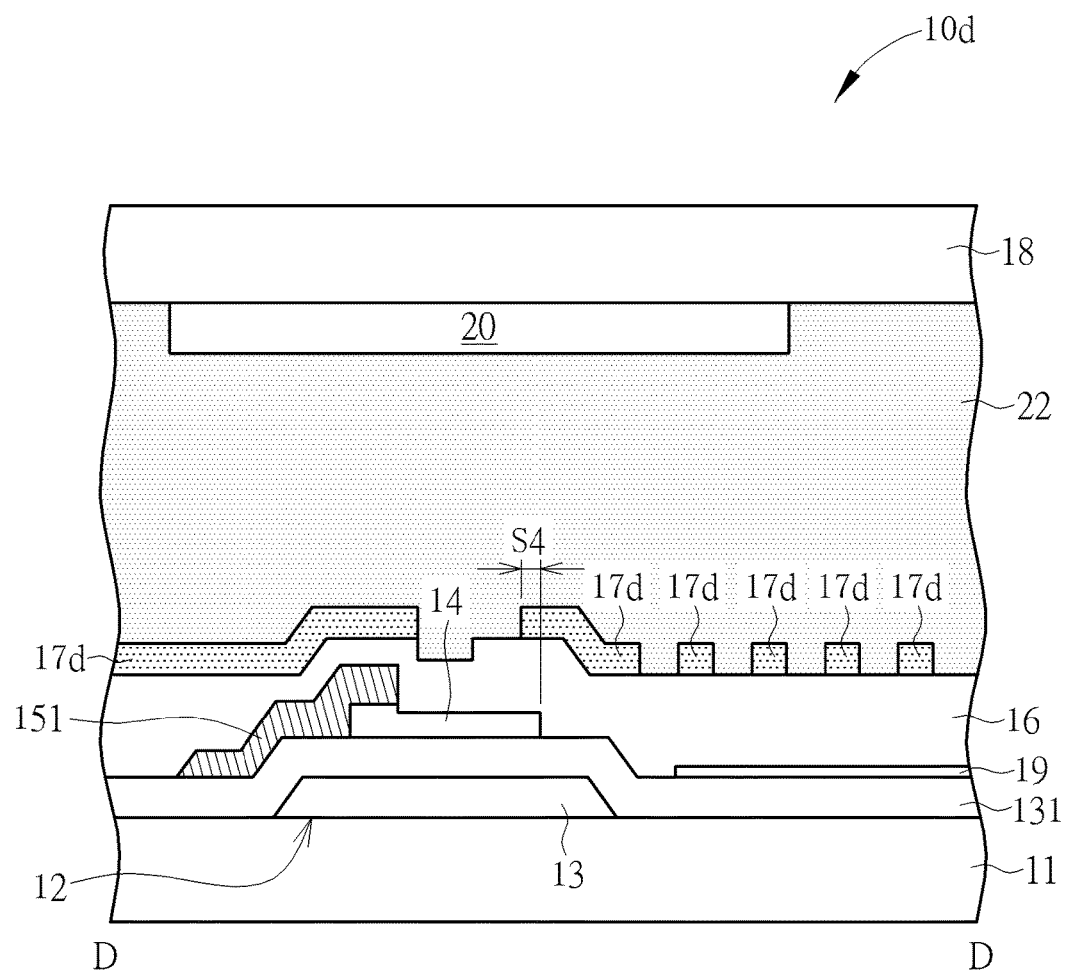
FIG. 7 is a cross-sectional view of a first pixel structure according to a fourth embodiment of the present invention.
Figure 8:
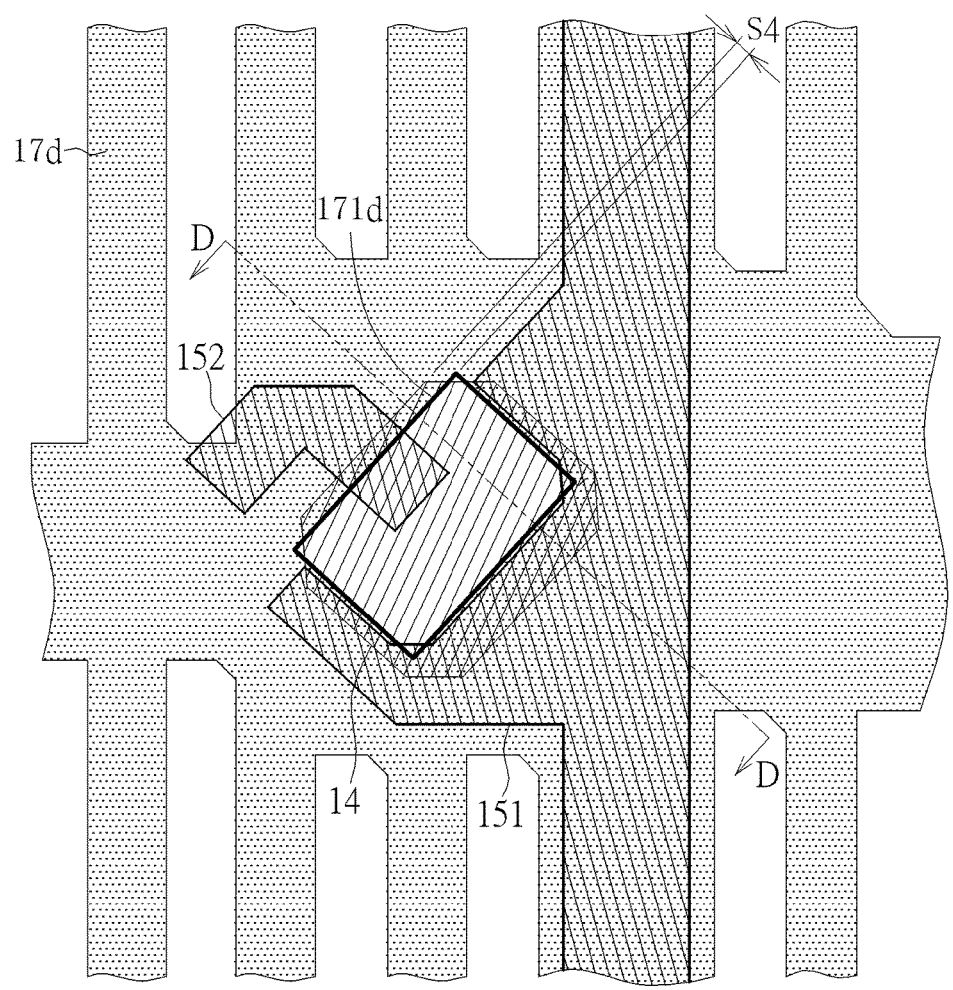
FIG. 8 is a top view of the first pixel structure of FIG. 7.

Please refer to FIG. 7 and also refer to FIG. 8. FIG. 7 is a cross-sectional view of a first pixel structure according to a fourth embodiment of the present invention. FIG. 8 is a top view of the first pixel structure of FIG. 7. FIG. 7 is the cross-sectional view along a direction D-D of FIG. 8 (points D in FIG. 8 are configured to show the direction, not to show the exact positions of the points). As shown in FIG. 7 and FIG. 8, a first pixel structure 10d of the fourth embodiment of the present invention is similar to the first pixel structure 10c of the third embodiment. The difference between them is a smaller opening 171d is formed in a transparent conduction layer 17d of the first pixel structure 10d of the fourth embodiment. The opening 171d is smaller than the opening 171c, such that a portion of the transparent conduction layer 17d is formed above the region of the semiconductor layer 14 not covered by the electrode layer 15. Since a portion of the drain electrode 152 covers the semiconductor layer 14, the direction D-D of the cross-sectional view is arranged at a side of the drain electrode 152 to clearly show the opening 171d of the transparent conduction layer 17d on a region of the semiconductor layer 14 not covered by the drain electrode 152. Wherein, a portion of the orthographic projection of the transparent conduction layer 17d on the first substrate 11 overlaps the orthographic projection of the region of the semiconductor layer 14 not covered by the electrode layer 15 on the first substrate 11. An overlapping distance S4 is between two fringes of the two orthographic projections beside the drain electrode 152 on the first substrate 11. The overlapping distance S4 can be less than 1 micrometers. In the overlapped region, even a portion of the transparent conduction layer 17d is formed above the region of the semiconductor layer 14 not covered by the electrode layer 15, the induced current between the transparent conduction layer 17d and the semiconductor layer 14 of the thin-film transistor 12 is small enough to ignore the leakage current of the thin-film transistor 12 when the thin-film transistor 12 is off. In the present embodiment, a dimension of the opening of the transparent conduction layer 17d is further decreased. The induced current between transparent conduction layer 17d and the semiconductor layer 14 of the thin-film transistor 12 is controlled in an allowable range. It is worth noting that, the shape of the opening 171d of the transparent conduction layer 17d in FIG. 8 is a rectangle, but the present invention is not limited thereto. For example, the shape of the opening 171d of the transparent conduction layer 17d can be any other shape close to the outline of the fringe of the semiconductor layer 14.

In the above embodiments, the first pixel structure can further comprise a liquid crystal layer 22. Moreover, the transparent conduction layer 17a, 17b, 17c and 17d can be a common electrode. In addition, the materials of the thin-film transistor and the insulation layer of the pixel structure of the present invention are not limited. The thin-film transistor of the pixel structure of the present invention can be made of oxide semiconductor materials. For example, the semiconductor layer of the thin-film transistor can be made of indium gallium zinc oxide (InGaZnOx), indium tin zinc oxide, indium gallium oxide, indium zinc oxide, gallium oxide, cadmium oxide, magnesium oxide, calcium Oxide, strontium oxide, barium oxide, titanium oxide, tantalum oxide, aluminum oxide, indium oxide, niobium oxide, hafnium oxide, tin oxide, zinc oxide, zirconia oxide, copper oxide, yttrium oxide, barium yttrium oxide and tin samarium oxide or made of a combination of them. A position of the gate insulation layer 131 adjacent to the semiconductor layer 14 comprises silicate ($SixOy$). The gate insulation layer 131 can be a double layer structure comprising a lower layer made of silicon nitride and a upper layer made of silicon oxide, or the gate insulation layer 131 can be a single layer structure made of silicon nitride or silicon oxide. The transistor insulation layer 16 can be a double layer structure comprising a lower layer made of silicon oxide and a upper layer made of silicon nitride, or the transistor insulation layer 16 can be a single layer structure made of silicon nitride or silicon oxide. In additional, an oxygen content of a position the transistor insulation layer 16 adjacent to the semiconductor layer 14 can be greater than an oxygen content of a position of the transistor insulation layer 16 away from the semiconductor layer 14. The pixel structure of the embodiments of the present invention can be made of above materials, but the present invention is not limited thereto.

Figure 9:
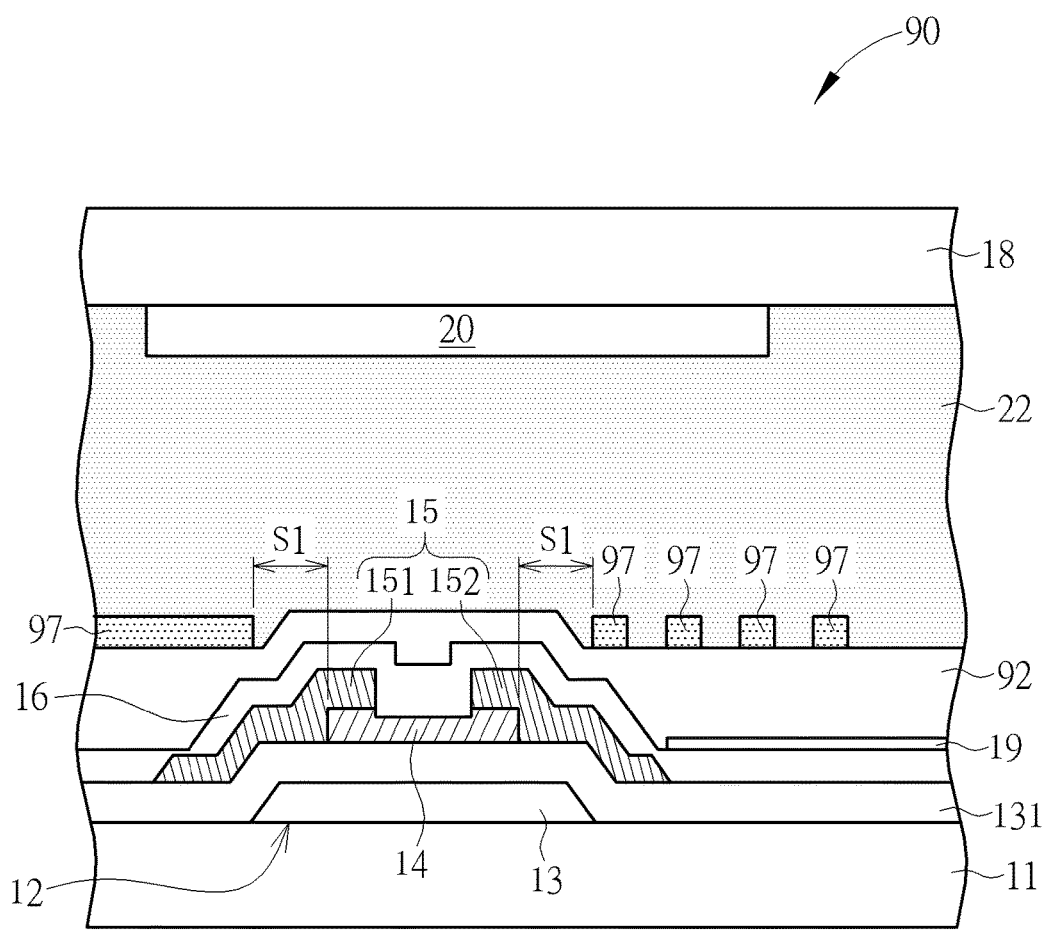
FIG. 9 is a cross-sectional view of a second pixel structure of the present invention.
Figure 10:
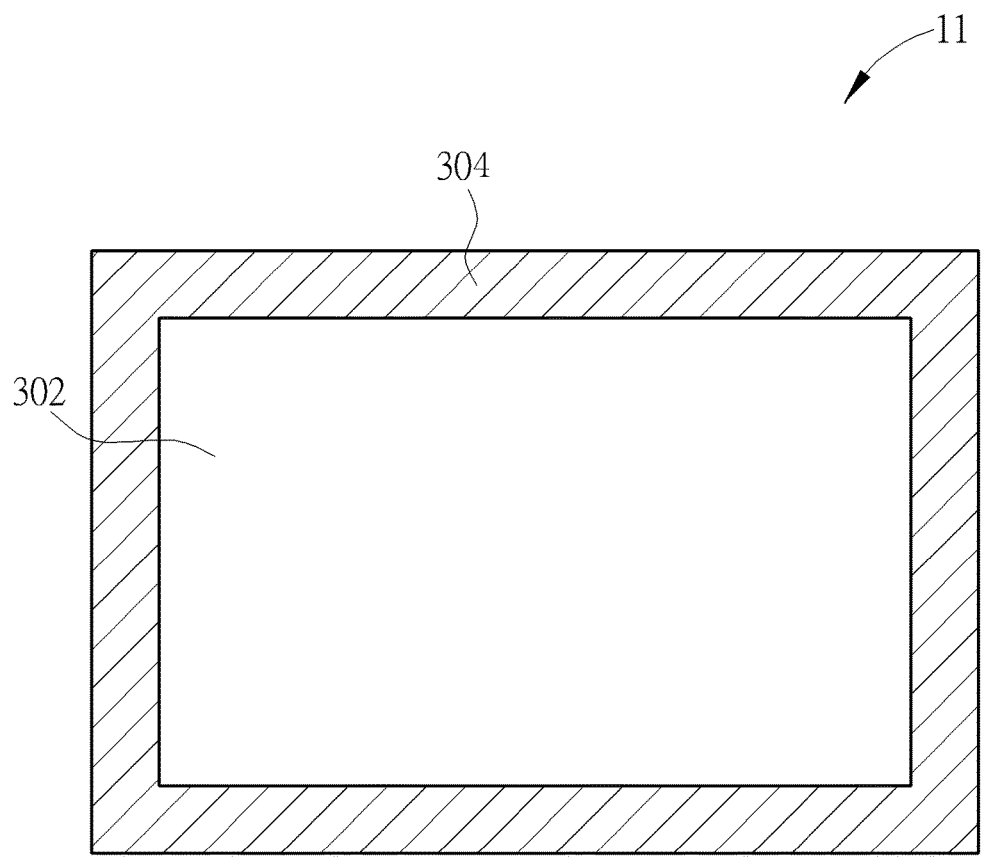
FIG. 10 is a diagram showing a display area and a surrounding area of the present invention.
Figure 11:
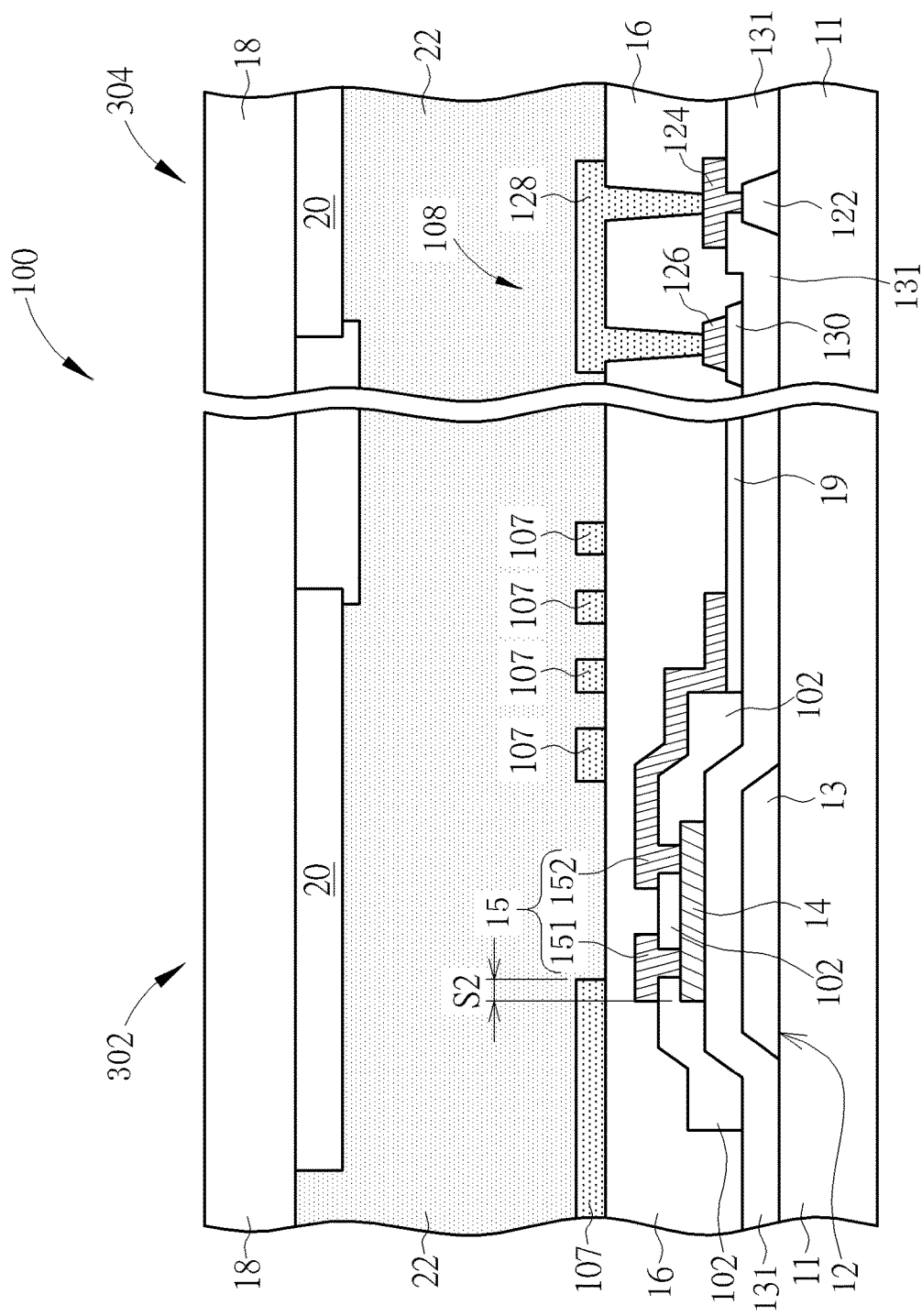
FIG. 11 is a cross-sectional view of a third pixel structure of the present invention.
Figure 12:
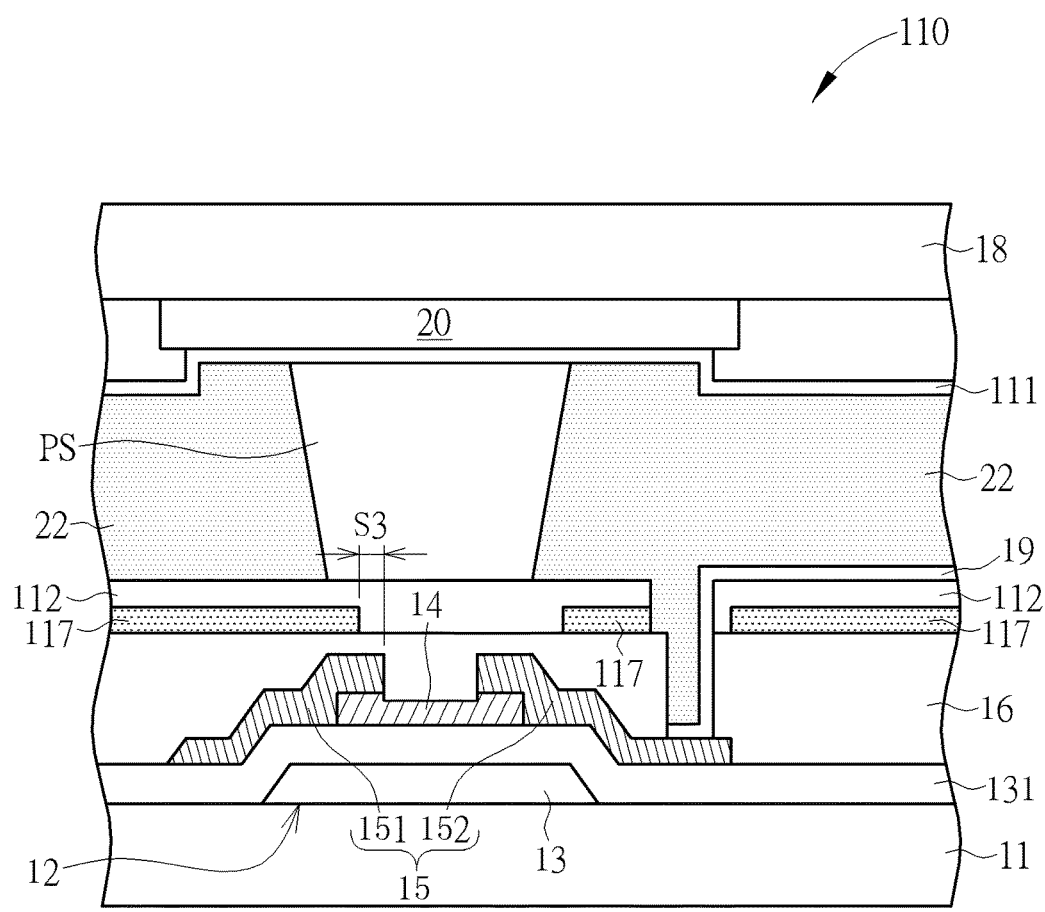
FIG. 12 is a cross-sectional view of a fourth pixel structure of the present invention.

According to above embodiments and FIG. 1 to FIG. 8, the first pixel structure is made by a manufacturing process of six photomasks, but the present invention is not limited thereto. The arrangement of the opening in the transparent conduction layer of first to fourth embodiments of the first pixel structure can be applied to different pixel structures. For simplification, here are three examples. FIG. 9, FIG. 11 and FIG. 12 are cross-sectional views for showing the present invention applied in different pixel structures. Please refer to FIG. 9. FIG. 9 is a cross-sectional view of a second pixel structure of the present invention. As shown in FIG. 9, a second pixel structure 90 of the present invention is similar to the first pixel structure 10a. The difference between them is the second pixel structure 90 is made by a manufacturing process of seven photomasks. The second pixel structure 90 further comprises a cover insulation layer 92. The pixel electrode layer 19 is formed between the transistor insulation layer 16 and the cover insulation layer 92. A transparent conduction layer 97 is formed on the cover insulation layer 92. Similar to the first embodiment of the first pixel structure, the distance is between a fringe of the orthographic projection of the transparent conduction layer 97 on the first substrate 11 and the fringe of the orthographic projection of the semiconductor layer 14 on the first substrate 11. The arrangement of the opening of the transparent conduction layer 97 of the second pixel structure 90 is similar to the arrangement of the opening of the first embodiment of the first pixel structure, but the present invention is not limited thereto. The arrangement of the opening of the transparent conduction layer 97 of the second pixel structure 90 can be similar to the arrangement of the opening of the second embodiment, the third embodiment or the fourth embodiment of the first pixel structure. Please refer to FIG. 10 and FIG. 11. FIG. 10 is a diagram showing a display area and a surrounding area of the present invention. FIG. 11 is a cross-sectional view of a third pixel structure of the present invention. As shown in FIG. 10 and FIG. 11, the first substrate 11 of the present invention comprises a display area 302 and a surrounding area 304. The semiconductor layer 14 of the display area 302 of the third pixel structure 100 comprises oxide semiconductor materials (such as InGaZnOx, IGZO). An active insulation layer 102 covers the semiconductor layer 14. Two via holes are formed in the active insulation layer 102 and configured to be penetrated through respectively by the source electrode 151 and the drain electrode 152 such that the source electrode 151 and the drain electrode 152 can be connected to the semiconductor layer 14. The transistor insulation layer 16 covers the thin-film transistor 12. A transparent conduction layer 107 is formed on the transistor insulation layer 16. Similar to the second embodiment of the first pixel structure of the present invention, a portion of an orthographic projection of the transparent conduction layer 107 on the first substrate 11 overlaps the orthographic projection of the semiconductor layer 14 on the first substrate 11. An overlapping distance S2 is between two fringes of the two orthographic projections on the first substrate 11. The arrangement of the opening of the transparent conduction layer 107 of the third pixel structure 100 is similar to the arrangement of the opening of the second embodiment of the first pixel structure, but the present invention is not limited thereto. The arrangement of the opening of the transparent conduction layer 107 of the third pixel structure 100 can be similar to the arrangement of the opening of the first embodiment, the third embodiment or the fourth embodiment of the first pixel structure. In addition, a trace-change structure 108 is formed on the first substrate 11 in the surrounding area 304. When a trace is formed but is blocked by some structures on the same surface, the trace-change structure 108 is configured to bypass the structures. The trace-change structure comprises a first trace 122, a second trace 124, a third trace 126, a connecting electrode 128 and a block structure 130. The first trace 122 is formed on the first substrate 11 and made of the same material as the gate electrode 13. The second trace 124 is formed on the gate insulation layer 131 and made of the same material as the electrode layer 15. A via hole is formed in the gate insulation layer 131 and configured to be penetrated through by the second trace 124 such that the second trace 124 can be electrically connected to the first trace 122. The block structure 130 is formed on the gate insulation layer 131 and made of the same material as the active insulation layer 102. The third trace 126 is formed on the block structure 130 and made of the same material as the electrode layer 15. The connecting electrode 128 is formed on the transistor insulation layer 16 and made of the same material as the transparent conduction layer 107. Two via holes are formed in transistor insulation layer 16 and configured to be penetrated through by the connecting electrode 128 such that the connecting electrode 128 can be respectively electrically connected to the second trace 124 and the third trace 126. It is noteworthy that the block structure 130 is configured to reduce the depth of the via hole for the third trace 126 in the transistor insulation layer 16. For example, when a trace layout in the surrounding area 304 is designed, the block structure 130 is pre-arranged at a position for forming the trace-change structure 108, such that the depth of the via hole for the third trace 126 in the transistor insulation layer 16 can be reduced, in order to further save manufacturing time. Please refer to FIG. 12. FIG. 12 is a cross-sectional view of a fourth pixel structure of the present invention. As shown in FIG. 12, a fourth pixel structure 110 is a TN-type pixel structure with high aperture ratio. Since the electric field in TN-type pixel structure is vertical, an opposite electrode layer 111 is formed between the second substrate 18 and the liquid crystal layer 22. A transparent conduction layer 117 is formed on the transistor insulation layer 16. A covering insulation layer 112 covers the transparent conduction layer 117. The pixel electrode layer 19 is formed on the covering insulation layer 112 and connected to the electrode layer 15 through a via hole. A spacer PS is formed on the covering insulation layer 112 for support. In addition, the opposite electrode layer 111 can be made of the same material as the transparent conduction layer 117, but the present invention is not limited thereto. Similar to the third embodiment of the first pixel structure, the distance S3 is between a fringe of the orthographic projection of the transparent conduction layer 117 on the first substrate 11 and a fringe of the orthographic projection of the region of the semiconductor layer 14 not covered by the electrode layer 15 on the first substrate 11. The arrangement of the opening of the transparent conduction layer 117 of the fourth pixel structure 110 is similar to the arrangement of the opening of the third embodiment of the first pixel structure, but the present invention is not limited thereto. The arrangement of the opening of the transparent conduction layer 117 of the fourth pixel structure 110 can be similar to the arrangement of the opening of the first embodiment, the second embodiment or the fourth embodiment of the first pixel structure.

In contrast to the prior art, the pixel structure of the present invention has an opening formed in the transparent conduction layer above the semiconductor layer to reduce the induced current between the transparent conduction layer and the thin-film transistor, in order to further reduce the leakage current of the thin-film transistor when the thin-film transistor is off. Therefore, the pixel structure of the present invention is able to solve problems of uneven brightness of display panel and cross-talk. Moreover, the pixel structure of the present invention is able to adjust the shape and dimension of the opening of the transparent conduction layer according to the aperture ratio and allowable range of induced current. Therefore, the pixel structure of the present invention can meet different design requirements for reducing the induced current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure, comprising:
   a first substrate;
   a thin-film transistor formed on the first substrate, the thin-film transistor comprising:
      a gate electrode formed on the first substrate;
      a semiconductor layer formed on the gate electrode;
      a first insulation layer located between the semiconductor layer and the gate electrode; and
      an electrode layer comprising:
         a source electrode covering a portion of the semiconductor layer; and
         a drain electrode covering a portion of the semiconductor layer;
   a second insulation layer covering the thin-film transistor, the thickness of the second insulation layer being less than 11000 Å;
   a first transparent conduction layer formed on the second insulation layer; and
   a second substrate arranged above the first substrate;
   wherein an opening is formed in the first transparent conduction layer along a fringe of the semiconductor layer, a shape of the opening is corresponding to an outline of the fringe of the semiconductor layer, the semiconductor layer is made of indium gallium zinc oxide (IGZO), a position of the first insulation layer adjacent to the semiconductor layer comprises silicate, and an oxygen content of the second insulation layer adjacent to the semiconductor layer is greater than an oxygen content of the second insulation layer away from the semiconductor layer.

2. The pixel structure of claim 1, wherein an orthographic projection of the first transparent conduction layer on the first substrate does not overlap an orthographic projection of the semiconductor layer on the first substrate.

3. The pixel structure of claim 2, wherein a distance between a fringe of the orthographic projection of the first transparent conduction layer on the first substrate and a fringe of the orthographic projection of the semiconductor layer on the first substrate is between 0 micrometers and 5 micrometers.

4. The pixel structure of claim 1, wherein a portion of the orthographic projection of the first transparent conduction layer on the first substrate overlaps the orthographic projection of the semiconductor layer on the first substrate.

5. The pixel structure of claim 4, wherein a distance between a fringe of the orthographic projection of the first transparent conduction layer on the first substrate and the fringe of the orthographic projection of the semiconductor layer on the first substrate is between 0 micrometers and 1.5 micrometers.

6. The pixel structure of claim 1, further comprising a liquid crystal layer formed between the first substrate and the second substrate, wherein the first transparent conduction layer is a common electrode.

7. The pixel structure of claim 6, further comprising a second transparent conduction layer formed on the first insulation layer.

8. The pixel structure of claim 6, further comprising a third insulation layer formed on the first transparent conduction layer; and a second transparent conduction layer formed between the third insulation layer and the liquid crystal layer.

9. The pixel structure of claim 6, further comprising a second transparent conduction layer formed between the second substrate and the liquid crystal layer.

10. The pixel structure of claim 1, wherein the first substrate comprises a display area and a surrounding area, and the surrounding area comprises a trace-change structure, wherein the trace-change structure comprises a first trace, a second trace, a third trace, a connecting electrode and a block structure, the first trace is formed on the first substrate, the second trace is formed on the first insulation layer, a via hole is formed in the first insulation layer and configured to be penetrated through by the second trace such that the second trace can be electrically connected to the first trace, the block structure is formed on the first insulation layer, the third trace is formed on the block structure, the connecting electrode is formed in the second insulation layer, two via holes are formed on the second insulation layer and configured to be penetrated through by the connecting electrode such that the connecting electrode can be respectively electrically connected to the second trace and the third trace.

11. The pixel structure of claim 1, wherein the semiconductor layer is a polygon having more than four edges.

12. A pixel structure for reducing induced current, comprising:
    a first substrate;
    a thin-film transistor formed on the first substrate, the thin-film transistor comprising:
       a gate electrode formed on the first substrate;
       a semiconductor layer formed on the gate electrode;
       a first insulation layer located between the semiconductor layer and the gate electrode; and
       an electrode layer comprising:
          a source electrode covering a portion of the semiconductor layer; and
          a drain electrode covering a portion of the semiconductor layer;
    a second insulation layer covering the thin-film transistor;
    a first transparent conduction layer formed on the second insulation layer; and
    a second substrate arranged above the first substrate;
    wherein an opening is formed in the first transparent conduction layer along a fringe of a region of the semiconductor layer not covered by the electrode layer, the first substrate comprises a display area and a surrounding area, the surrounding area comprises a trace-change structure, the trace-change structure comprises a first trace, a second trace, a third trace, a connecting electrode and a block structure, the first trace is formed on the first substrate, the second trace is formed on the first insulation layer, a via hole is formed on the first insulation layer and configured to be penetrated through by the second trace such that the second trace can be electrically connected to the first trace, the block structure is formed on the first insulation layer, the third trace is formed on the block structure, the connecting electrode is formed on the second insulation layer, and two via holes are formed in the second insulation layer and configured to be penetrated through by the connecting electrode such that the connecting electrode can be respectively electrically connected to the second trace and the third trace.

13. The pixel structure of claim 12, wherein a shape of the opening is corresponding to an outline of the fringe of the region of the semiconductor layer not covered by the electrode layer.

14. The pixel structure of claim 12, wherein an orthographic projection of the first transparent conduction layer on the first substrate does not overlap an orthographic projection of the region of the semiconductor layer not covered by the electrode layer on the first substrate.

15. The pixel structure of claim 12, wherein a distance between a fringe of the orthographic projection of the first transparent conduction layer on the first substrate and a fringe of the orthographic projection of the region of the semiconductor layer not covered by the electrode layer on the first substrate is between 0 micrometers and 3.5 micrometers.

16. The pixel structure of claim 12, wherein a portion of the orthographic projection of the first transparent conduction layer on the first substrate overlaps the orthographic projection of the region of the semiconductor layer not covered by the electrode layer on the first substrate.

17. The pixel structure of claim 16, wherein a distance between the fringe of the orthographic projection of the first transparent conduction layer on the first substrate and the fringe of the orthographic projection of the region of the semiconductor layer not covered by the electrode layer on the first substrate is between 0 micrometers and 1 micrometers.

18. The pixel structure of claim 12, further comprising a liquid crystal layer formed between the first substrate and the second substrate, wherein the first transparent conduction layer is a common electrode.

19. The pixel structure of claim 18, further comprising a second transparent conduction layer formed on the first insulation layer.

20. The pixel structure of claim 18, further comprising a third insulation layer formed on the first transparent conduction layer, and a second transparent conduction layer formed between the third insulation layer and the liquid crystal layer.

21. The pixel structure of claim 18, further comprising a second transparent conduction layer formed between the second substrate and the liquid crystal layer.

22. The pixel structure of claim 12, wherein the semiconductor layer is a polygon having more than four edges.

23. A pixel structure, comprising:
a first substrate;
a thin-film transistor formed on the first substrate, the thin-film transistor comprising:
　a gate electrode formed on the first substrate;
　a semiconductor layer formed on the gate electrode;
　a first insulation layer located between the semiconductor layer and the gate electrode; and
　an electrode layer comprising:
　　a source electrode covering a portion of the semiconductor layer; and
　　a drain electrode covering a portion of the semiconductor layer;
a second insulation layer covering the thin-film transistor, the thickness of the second insulation layer being less than 11000 Å;
a first transparent conduction layer formed on the second insulation layer; and
a second substrate arranged above the first substrate;
wherein an opening is formed in the first transparent conduction layer along a fringe of the semiconductor layer, a shape of the opening is corresponding to an outline of the fringe of the semiconductor layer, the first substrate comprises a display area and a surrounding area, the surrounding area comprises a trace-change structure, the trace-change structure comprises a first trace, a second trace, a third trace, a connecting electrode and a block structure, the first trace is formed on the first substrate, the second trace is formed on the first insulation layer, a via hole is formed in the first insulation layer and configured to be penetrated through by the second trace such that the second trace can be electrically connected to the first trace, the block structure is formed on the first insulation layer, the third trace is formed on the block structure, the connecting electrode is formed in the second insulation layer, and two via holes are formed on the second insulation layer and configured to be penetrated through by the connecting electrode such that the connecting electrode can be respectively electrically connected to the second trace and the third trace.

* * * * *